(12) United States Patent
Ito et al.

(10) Patent No.: US 7,464,315 B2
(45) Date of Patent: Dec. 9, 2008

(54) SEMICONDUCTOR MEMORY DEVICE

(75) Inventors: Yutaka Ito, Tokyo (JP); Eiji Yamasaki, Tokyo (JP); Hidetoshi Iwai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 509 days.

(21) Appl. No.: 11/154,467

(22) Filed: Jun. 17, 2005

(65) Prior Publication Data
US 2005/0286330 A1 Dec. 29, 2005

(30) Foreign Application Priority Data
Jun. 18, 2004 (JP) ............................. 2004-181736

(51) Int. Cl.
*H03M 13/00* (2006.01)
(52) U.S. Cl. .................................................... 714/754
(58) Field of Classification Search ................. 714/736, 714/746, 754, 763
See application file for complete search history.

(56) References Cited

U.S. PATENT DOCUMENTS

| | | | |
|---|---|---|---|
| 5,402,010 A | 3/1995 | Muraoka | |
| 5,737,258 A | 4/1998 | Choi et al. | |
| 5,963,475 A | 10/1999 | Choi et al. | |
| 6,298,000 B1 * | 10/2001 | Kitade et al. | 365/222 |
| 6,373,768 B2 | 4/2002 | Woo et al. | |
| 6,456,517 B2 | 9/2002 | Kim et al. | |
| 6,744,656 B2 * | 6/2004 | Sugano et al. | 365/51 |
| 7,216,198 B2 | 5/2007 | Ito et al. | |

FOREIGN PATENT DOCUMENTS

| | | |
|---|---|---|
| JP | 4149899 A | 5/1992 |
| JP | 522110 A | 1/1993 |
| JP | 547197 A | 2/1993 |
| JP | 5314762 A | 11/1993 |
| JP | 696583 A | 4/1994 |
| JP | 8306195 A | 11/1996 |
| JP | 9213071 A | 8/1997 |
| JP | 10188580 A | 7/1998 |
| JP | 2001266580 A | 9/2001 |
| JP | 2002-56671 A | 2/2002 |
| JP | 2003-68076 A | 3/2003 |
| JP | 2004-152378 A | 5/2004 |
| JP | 2004152378 A | 5/2004 |

* cited by examiner

*Primary Examiner*—Shelly A Chase
(74) *Attorney, Agent, or Firm*—Sughrue Mion, PLLC

(57) ABSTRACT

Disclosed is a semiconductor memory device having a data retention operating mode. When an entry into the data retention operating mode is performed, parity information on data of the memory cells is calculated and the error correction on the memory cells is carried out at a time of an exit from the data retention operating mode, by an ECC (Error Correction Circuit). The semiconductor memory device includes means for outputting from an NC pin flag information indicating that the semiconductor memory device is the one including the data retention operating mode, that the exit processing from the data retention operating mode is under way, and that the error correction cannot be performed.

24 Claims, 13 Drawing Sheets

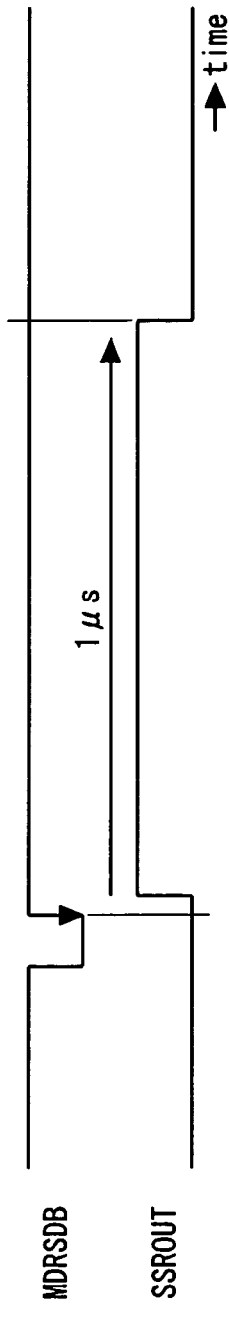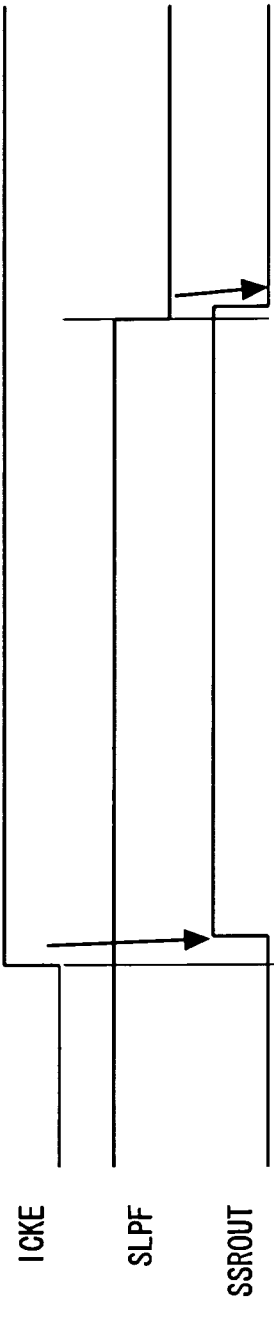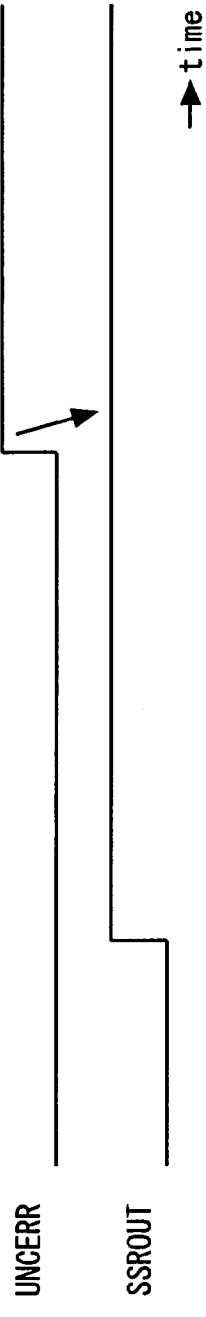

SSR FLAG OUTPUT CIRCUIT

SEMICONDUCTOR MEMORY DEVICE

FIELD OF THE INVENTION

The present invention relates to a semiconductor memory device. More specifically, the invention relates to a semiconductor device of which an internal state can be observed externally.

BACKGROUND OF THE INVENTION

Among dynamic-type semiconductor memory devices that require refreshing for data retention, there is known the semiconductor memory device in which an on-chip ECC (Error Correction Circuit) is included therein. In these devices, when a data retention operating mode is entered by input of an entry command to enter into the data retention operating mode, the ECC performs encoding (parity bit generation) on all bits in a memory cell array. Then, as an exit operation through input of an exit command, decoding (error correction) on all the bits is performed, thereby extending a refresh cycle and reducing a data retention current more than the capability of the device (capability such as a data retention characteristic or the like) (refer to Patent Documents 1 and 2, for example). Such a data retention operating mode is referred to as a "Super Self Refresh mode" (abbreviated as the "SSR mode") herein. For details of the ECC (an ECC-CODEC) in a semiconductor integrated circuit device having the "SSR mode" and state transitions in the SSR mode, Patent Documents 1 and 3, and the like, for example, will be referred to.

An example of an operation of the SSR mode, as a prerequisite for the present invention, will be described with reference to FIGS. 1 and 2. FIG. 1 is a diagram showing an example of a typical configuration of the semiconductor memory device provided with the ECC-CODEC that includes an encoding circuit and a decoding circuit as the ECC and an ECC controller. The present invention is suitably applied to the configuration shown in FIG. 1, to which a reference is made in the description of embodiments of the present invention.

Referring to FIG. 1, this semiconductor memory device (or the semiconductor integrated circuit device provided with the semiconductor memory device) is an SDRAM (Synchronous Dynamic Random Access Memory: referred to as the "SDRAM"). In this SDRAM 10, though no specific limit is placed thereon, four memory arrays (MEMORY ARRAYs) 200A to 200D are provided corresponding to four memory banks (BANKs 0 to 3). Each of the memory arrays 200A to 200D corresponding to the four memory banks 0 to three (BANKs 0 to 3) includes dynamic-type memory cells arranged in a matrix form. Then, in each memory array, gate terminals of memory cell transistors not shown are connected to word lines (not shown), ones of drains and sources of the memory cell transistors are connected to complementary bit lines (not shown) for respective rows, and the others of the drains and sources are connected to one ends of capacitor elements for data storage. According to a result of decoding of a row address signal by a row decoder (ROW DECODER & LATCH) 201, a word driver (WORD DRIVER) 202 drives a selected word line (not shown) in the bank0 memory array 200A to a high potential. The complementary bit lines (not shown) in the memory array 200A are connected to IO lines by sense amplifiers (SENSE AMPLIFIERS) 203, I/O gating write drivers (I/O GATING WRITE DRIVERS) 204 and a column decoder (COLUMN DECORDER) 205 as a column selection circuit. A main amplifier and a write amplifier are included in each I/O gating write driver 204.

Each of the sense amplifiers 203 receives and detects a minute potential difference resulting from data reading from a selected memory cell on each pair of the complementary bit lines to amplify the potential difference. The I/O gating write drivers 204 includes column switch MOS transistors for selecting the complementary bit lines and electrically connecting the complementary bit lines to the complementary I/O lines. A column switch MOS transistor is selected for operation according to the result of decoding of a column address signal by the column address decoder. Likewise, for the memory arrays 200B-200D in the banks 1 through 3, the row decoder (ROW DECODER & LATCH), sense amplifiers (SENSE AMPLIFIERS), I/O gating write drivers (I/O GATING WRITE DRIVERS), and column decoder (COLUMN DECODER) are provided.

The I/O lines are made to be common to the respective memory banks, and are connected to the output terminal of a data input register (DATA INPUT REGISTER) 210 and the input terminal of a data output register (DATA OUTPUT REGISTER) 211. Terminals DQ0 to DQ15 (for 16 bits) are data input/output terminals, and are the data input/output terminals for inputting or outputting data D0 to D15 (a low-order byte D0 to D7 and a high-order byte D8 to D15). DQML and DQMU are control signals for byte control for controlling input/output buffers. The DQML controls the input buffer for the lower-order byte, while the DQMU controls the input buffer for the higher-order byte.

Bits A0 to A12 of 15-bit address signal supplied from an address input terminal are temporally held in an address register (ADD REG) 213. Among the address signals input sequentially, a row-address signal for selecting a memory cell is supplied to the row decoder 201 of each memory bank through a row address multiplexer (ROW ADD MUX) 206. A13 and A14 are assigned to BA0 and BA1 for selecting the memory bank described above, and are supplied to a bank control logic (BANK CONTROL LOGIC) circuit 212, where a selection signal for performing selection among the four memory banks described above is formed, and supplied to the row decoder 201. A column-address signal is held in a column-address counter/latch (COLUMN-ADDRESS COUNTER/LATCH) 207.

A refresh counter (REFRESH. COUNTER) 208 generates a row address for a self refresh (Self Refresh). When a storage capacity of 256 Mbits is included, for example, and in the case of an x8-bit configuration, an address signal of nine bits are made to be effective as the column address signal. To the column address counter 207, the column address signal input sequentially is supplied as preset data. Then, in a burst mode specified by a command which will be described hereinafter, the column address signal as the preset data or a value obtained by sequentially incrementing the column address signal is output to the column decoder 205 of each memory bank.

A control logic (CONTROL LOGIC) 209 constitutes a circuit for an SDRAM interface, and includes a command decode (COMMAND DECODE) circuit 2091, a self-refresh control (SELF-REF CONTROL) 2092, and a mode register (MODE REGISTER) 2093. The mode register 2093 holds information on various operating modes (such as a burst length and CAS latency information) for the semiconductor memory device.

The command decode circuit 2091 receives an external command and an internal command according to an operating mode, for decoding.

The self-refresh control circuit 2092 is a control block for the self refresh, and performs a refreshing operation and executes its cyclic control.

Only the row decoder 201 corresponding to the bank specified by the bank control logic circuit (BANK CONTROL LOGIC) 212 operates and performs a word line selecting operation.

In an example shown in FIG. 1, to the control logic 209, external control signals such as a clock signal CLK, a clock enable signal CKE, a chip select signal CS, a column address strobe signal CAS, a row address strobe signal RAS, and a write enable signal WE, a DQM (DQ mask: for controlling the high impedance state of the output buffer of a DQ terminal), and the address signal through the mode register 2093 are supplied. The control logic 209 generates internal timing signals for controlling the operation of circuit blocks described above and the operating mode of the SDRAM based on a change in the levels of these signals and timings of these signals and includes input buffers (not shown) for the respective signals. Other external input signals are made to be significant in synchronization with the rising edge of the internal clock signal. The chip select signal CS at its low level commands a start of a command input cycle. When the chip select signal CS is at a high level (or a chip non-selection state), other inputs are not significant. However, a memory bank selection state and an internal operation such as a burst operation are not influenced by a change to the chip non-selection state. Functions of the respective signals such as the RAS, CAS, and WE are different from those of the corresponding signals in ordinary DRAMs, and these signals are made to be significant when a command cycle is defined.

The clock enable signal CKE is the signal to instruct effectiveness of the subsequent clock signal CLK. The clock enable signal CKE at the high level indicates that the rising edge of the subsequent clock signal CLK is effective. The clock enable signal CKE at the low level indicates that the rising edge of the subsequent clock signal CLK is ineffective.

The row address signal is defined by the levels of the A0 to A12 in a row address strobe and bank active command cycle that is synchronized with the rising edge of the clock signal CLK (an internal clock signal ICLK not shown, generated from the CLK).

The address bits A13 and A14 (the BA0 and BA1 in FIG. 1) are regarded as a bank selection signal in the row address strobe and bank active command cycle. That is, by a combination of the BA0 and the BA1, one of the four memory banks 0 to 3 is selected. Control over memory bank selection can be performed by processing such as activation of only the row decoder of a selected memory bank, no selection of any column switch circuits of unselected memory banks, and connection to only the data input circuit 210 and a data output circuit of the selected memory bank. Assume that while the burst operation is performed in one memory bank, another memory bank is designated and a row address strobe and bank active command is supplied in the SDRAM. Then, the operation of a row address system in the another memory bank becomes possible with no influence exerted on the operation of the memory bank in which the burst operation is being executed. Accordingly, as long as there is no data collision at the data input/output terminals DQ0 to DQ 15 for data constituted from 16 bits, during execution of a command on which processing has not been finished, it is possible to issue a precharge command, and the row address strobe and bank active command for a memory bank different from a memory bank targeted for processing by the command being executed can be issued and to start an internal operation in advance.

Referring to FIG. 1, reference numeral 1 denotes a signal supplied from the SDRAM interface, for starting and stopping an ECC controller 6.

Reference numeral 2 denotes an internal command signal or a JOB completion signal for the SDRAM interface, supplied from the ECC controller 6. When an encoding operation or a decoding operation is completed, for example, a READY signal is output.

Reference numeral 3 denotes an internal address signal supplied from the ECC controller 6 to an address register 213.

Reference numeral 4 denotes an operating mode signal for an ECC encoding and decoding circuit (ECC-CODEC) 7. The signal is controlled from the ECC controller 6 according to an operation.

Reference numeral 5 denotes an error detection signal or an error location detection signal (ERROR LOCATION) from the ECC-CODEC (encoding and decoding circuit) 7 to the ECC controller 6.

Reference numeral 6 denotes the ECC controller (one set/four banks). An internal command and an internal address are output from the ECC controller 6, thereby controlling the internal operation of the SDRAM and also controlling the ECC-CODEC (codec) 7 according to an operation.

Reference numeral 7 denotes the ECC-CODEC, which includes the encoding circuit and the decoding circuit. The ECC-CODEC performs a syndrome calculation, parity bit calculation, and error detection and correction.

Reference numeral 14 denotes the memory array of a bank memory, reference numeral 15 denotes a parity region. Parity information of memory cell data calculated by the ECC-CODEC 7 is stored in the parity region 15.

A cyclic code (Cyclic Code) is employed for the ECC (for error detection and correction) mounted on chip on a DRAM, and implements reduction of a standby current resulting from correction (masking) of a faulty refresh at the time of a self refresh. When the cyclic code is applied for the ECC, the circuit size of the encoding/decoding (CODEC) circuit that constitutes the ECC is also reduced. Thus, a code length can be increased, the number of parity bits can be reduced, and an increase in the chip area due to the on-chip ECC for the DRAM can be minimized.

As described above, due to the SSR mode, the semiconductor memory device includes the ECC controller 6 and the EC-CODEC 7 (including the encoding circuit for generating parity bits from original memory data and the decoding circuit for generating error-corrected memory data from the parity bits and read data from the memory). The ECC controller 6 issues an internal command 2 and an internal address 3 to the SDRAM 10 by itself. The command decode circuit (COMMAND DECODE) 2091 is configured to receive both the external command and the internal command 2. The ECC controller 6 issues the operating mode control signal 4 for the CODEC as a control command to the ECC-CODEC 7, and receives the error detection (ERROR)/error location detection (LOCATION) signal 5 from the ECC-CODEC 7 to perform a parity bit generation and writing operation and an error correcting operation efficiently.

Next, referring to FIG. 2, an example of a typical operation in the SSR (Super Self-Refresh) mode in the semiconductor memory device in FIG. 1 will be outlined. In the semiconductor memory device shown in FIG. 1, the command decode circuit (COMMAND DECODE) 2091 of the control logic (CONTROL LOGIC) 209 of the SDRAM 10 decodes the external command constituted from a combination of the signals CKE, CS, WE, CAS, and RAS. Then, when it is found that the command is the command to enter into the SSR mode (SSELF: refer to a third signal waveform "External Operation" from the top in FIG. 2), the command decode circuit 2091 sends a start (START) command signal (ENCODE) to the ECC controller 6 as the control signal 1.

The start command signal (ENCODE) is shown as a rise of a fourth signal waveform "ENCODE" from the top in FIG. 2.

Supply of the external clock signal CLK to the SDRAM 10 is stopped at a point of time when the command decode circuit (COMMAND DECODE) 2091 has received the SSR entry command (SSELF)(refer to a second signal "CLK" from the top in FIG. 2).

When the ECC controller 6 receives the start command signal (ENCODE), the internal clock signal ICLK (refer to the "ICLK" in FIG. 2) is supplied to the ECC controller 6. The ECC controller 6 sends out an "encoding" command to the ECC-CODEC 7 as the operating mode control signal 4.

Upon receipt of the "encoding" command as the operating mode control signal 4, the ECC-CODEC 7 starts an encoding operation. That is, the ECC-CODEC 7 generates parity data (check bits for error detection and correction) based on information data held by each bank in the memory, and writes the generated data in the parity memory region (PARITY indicated by reference numeral 15 in FIG. 1) of each bank in the memory (refer to "Parity Generation with Refresh" in an "Internal Operation" in the lowest line in FIG. 2).

When the generation of the parity data and the writing of the generated data in the parity memory region (PARITY) by the ECC-CODEC 7 have been completed, the ECC controller 6 outputs the completion signal READY (refer to the second "READY" from the bottom in FIG. 2) to the command decode circuit (COMMAND DECODE) 2091 as the internal command 2.

When the command decode circuit (COMMAND DECODE) 2091 receives the completion signal READY as the internal command 2 and decodes the signal, the command decode circuit 2091 stops supply of the start command signal ENCODE (refer to FIG. 2) to the ECC controller 6. Supply of the internal clock ICLK to the ECC controller 6 is also stopped (refer to the "ICLK" in FIG. 2).

When the command decode circuit (COMMAND DECODE) 2091 receives the completion signal READY as the internal command 2 and decodes the signal, the self-refresh control circuit 2092 of the control logic (CONTROL LOGIC) 209 starts a "Super Self-Refresh" (super self-refresh) operation in FIG. 2. In this "Super Self-Refresh" operation, an internal power supply for turning off a part of an internal power supply circuit are turned off (a "POFF" state: refer to the "Internal Operation" in the lowest line in FIG. 2), the power supply turned-off state is maintained for a predetermined period (such as 10 seconds), the internal power supply circuit in the off state is then recovered, the internal power supply is turned on (a "PON" state: refer to the "Internal Operation" in FIG. 2), and then a normal refresh (a "Burst-Refresh": refer to the "Internal Operation" in the lowest line in FIG. 2) is carried out. Then, the "POFF", "PON", and "Burst-Refresh" are repeated arbitrary times. In the "Burst-Refresh", all words in the memory cell array are intensively refreshed in a cycle shorter than in an ordinary self refresh. However, error correction based on the parity data is not carried out.

When the command to enter into the SSR mode (SSELF) is fed to the command decode circuit 2091 during an ordinary operation (in an idle state) and the SSR mode is entered, as described above, the ENCODE signal is activated, so that processing for the parity data generation and writing of the generated parity data in the parity region 15 ("Parity Generation with Refresh") is performed (the foregoing description refers to the processing in an "ENTRY-TIME"). Then, together with the operation of turning off the power supply, the "Super Self-Refresh" operation is performed. In accordance with the turning off of an internal signal source, most of the internal power supply (such as the cell array unit (having a boost potential VPP, a substrate potential VBB, and the like)) and an internal power supply generation circuit for a peripheral circuit unit are turned off (to 0v: a ground potential), so that the memory is entered into the state of a long-period pause state (a wait with the internal power supply circuit stopped).

Then, as shown in FIG. 2, an internal signal GSTATE is generated, which indicates that the supply potential of the internal power supply circuit has risen completely.

When the signal GSTATE undergoes a transition from a low level to a high level during a "Super Self-Refresh" period, i.e., when the power is turned on again, the operation of the "Burst-Refresh" (burst-refresh) for continuously performing a refresh on all the cells is performed.

After the operations of turning off the internal power supply (POFF), the long-period pause, turning on the internal power supply (PON), and the burst-refresh (Burst-Refresh) are repeated the arbitrary times (operations in the "Super Self-Refresh"), an SSR exit command (SSELFX) is entered, so that the SSR mode is ended. A memory cell data error generated by the influence of the long-period pause of the refresh is corrected and rewriting (refer to "Correct with Refresh" of the "Internal Operation" in FIG. 2) is executed (processing in an "EXIT-TIME"). That is, the command decode circuit (COMMAND DECODE) 2091 of the control logic (CONTROL LOGIC) 209 in the SDRAM 10 decodes the external command constituted from the combination of the signals CKE, CS, WE, CAS, and RAS. When it is found that the external command is the SSR exit command (SSELFX: refer to the "External Operation" in FIG. 2), the command decode circuit (COMMAND DECODE) 2091 sends out a stop (STOP) command signal (DECODE) to the ECC controller 6 as the control signal 1. That is, the stop command signal (DECODE) (refer to the "DECODE" in FIG. 2) is activated (made high). When the ECC controller 6 receives the stop command signal (DECODE), the internal clock signal ICLK (refer to FIG. 2) is supplied, and a "decode" command is sent out to the ECC-CODEC 7 as the operating mode control signal 4.

When the ECC-CODEC 7 receives the "decode" command as the operating mode control signal 4, the ECC-CODEC 7 starts a decoding operation. That is, the ECC-CODEC 7 reads out the parity data and also corrects an information data error based on the parity data and information data held by the memory, and performs rewriting. The error correction and the rewriting are performed on all the cells in a memory region. When the error correction and the rewriting by the ECC-CODEC 7 is finished, the ECC controller 6 outputs the completion signal (READY) to the command decode circuit (COMMAND DECODE) 2091 as the internal command 2.

When the command decode circuit (COMMAND DECODE) 2091 receives the completion signal READY as the internal command 2 for decoding, the command decode circuit stops supply of the stop command signal DECODE to the ECC controller 6. Supply of the internal clock signal ICLK to the ECC controller 6 is also stopped.

With this arrangement, the semiconductor memory device exists from the SSR mode, and returns to a normal operation (a normal "Self-Refresh" operation in the case of FIG. 2). During the decode processing at the time of the exit, a self refresh (distributed refresh: Distributed Refresh) is performed as necessary.

As a semiconductor device equipped with the output function of flag information, a configuration in which the information is detected by a temperature sensor and the information is output from a flag pin is described in Patent Document 3, for example.

[Patent Document 1]
    JP Patent Kokai Publication No. JP-P2004-152378A

[Patent Document 2]
    JP Patent Kokai Publication No. JP-P2002-056671A

[Patent Document 3]
    JP Patent Kokai Publication No. JP-P2003-68076A

[Patent Document 4]
    U.S. Pat. No. 6,373,768

SUMMARY OF THE DISCLOSURE

The semiconductor memory device that has the SSR (Super Self Refresh) mode, described with reference to FIGS. 1 and 2 has problems described below. The problems were newly found by the inventors of the present invention who have been engaged in development of the device having the SSR mode.

The current semiconductor memory device having the SSR mode does not include the function of outputting information for identifying the device that has the SSR mode. For this reason, if a semiconductor memory device having the SSR mode and a semiconductor memory device without having the SSR mode are to be mixed in a same system for use, it becomes necessary to additionally develop a system dedicated to the semiconductor memory device having the SSR mode. As a result, the number of development steps is increased, so that the cost is also increased.

Further, the exit command from the SSR mode (SSELFX) is executed by setting the clock enable signal CKE at a low level to a high level and feeding the command (SSELFX) to the command decode circuit 2091, as shown in FIG. 2. Though the exit command for a normal self refresh (SR) is used as this exit command, an exit operation (in the "EXIT-TIME" in FIG. 2) in the device having the SSR mode requires an incomparably longer waiting time (~100 ms) than the exit time for the ordinary self refresh (SR). For this reason, it is necessary for the system to perform switching control over an exit sequence from the SSR mode, beside the normal self refresh.

Further, it is desirable that the semiconductor memory device having the SSR mode includes a function of reducing the exit time from the SSR mode according to the capability of the device (such as the holding characteristic of a memory cell). That is, in the exit operation from the SSR mode, a decoding operation (an error correcting operation) on all the bits is performed, and its time greatly depends on an error rate (the number of fail bits). If the number of errors is approximately several bits, the time of the exit operation is reduced to about a half. The exit operation from the SSR mode greatly depends on the internal state of the device as well. However, when an entry operation (encoding on all the bits) is suspended and an exit is performed, an error will not be generated and a decoding operation becomes unnecessary. Thus, the exit time is reduced to approximately 100 µs.

Then, it is preferable that a function enabling the system to judge whether the exit operation from the SSR mode has been normally completed (whether an error that cannot be corrected has been generated) is included. In the conventional semiconductor memory device, a method is employed in which a check bit region is provided, for example, and then a specific data pattern is stored therein, and by reading out the check bit region at a time of recovery from the data retention operating mode in which only data retention is performed, it is determined whether the normal recovery has been performed or not. In this case, even if the self refresh has been employed, an effective exit time becomes the one as comparable to an exit processing time in the SSR mode described above (refer to the "EXIT-TIME" in FIG. 2).

Accordingly, It is an object to provide a semiconductor memory device having a data retention operating mode where parity information is generated at a time of an entry and error correction is performed in exit processing, of which the internal state of the data retention operating mode can be observed from an outside.

Another object of the present invention is to provide a semiconductor memory device having a data retention operating mode where parity information is generated at a time of an entry and error correction is performed in exit processing, which achieves reduction of an effective exit time and also eliminates the need for a check bit region.

The above and other objects are attained by the present invention, generally configured as follows:

A device according to one aspect of the present invention is the semiconductor device having a memory array including: a plurality of memory cells each requiring a refresh operation for data retention; and an ECC (Error Correction Circuit);

the semiconductor memory device performing calculation of parity information on data of the memory cells by an ECC (Error Correction Circuit) when the semiconductor memory device enters into a data retention operating mode and performing error correction of the memory cells at a time of an exit from the data retention operating mode;

the semiconductor memory device further including a circuit for outputting from a predetermined output terminal flag information indicating that the semiconductor memory device is the semiconductor memory device equipped with a function of the data retention operating mode.

In the present invention, a mode register in which initial setting of an operating mode of the semiconductor memory device is performed may be provided, and the flag information may be output in response to input of a mode register setting command for performing setting of the mode register at power-on or the like.

In the present invention, the flag information may be output for a predetermined period.

In the present invention, the output of the flag information may be stopped in response to the mode register setting command input after the predetermined period.

In the present invention, when the exit from the data retention operating mode is performed, flag information indicating that processing for the exit is under way may be output from the predetermined output terminal.

In the present invention, preferably, during the processing for the exit from the data retention operating mode, a reentry into the data retention operating mode can be made.

In the present invention, when a reentry into the data retention operating mode is made during the processing for the exit from the data retention operating mode, an output pin may be set to a high impedance state.

The present invention includes means for outputting from the predetermined output pin flag information indicating that the error correction cannot be performed when the ECC determines that the error correction cannot be performed during the processing for the exit from the data retention operating mode.

In the present invention, the flag information indicating that the error correction cannot be performed may be output for a predetermined period after completion of the processing for the exit.

A semiconductor memory device including a memory cell array having a plurality of memory cells each requiring a refresh operation for data retention according to the present invention includes:

an input pin for receiving a reset signal, said input pin being one of non-connection pins; and a circuit for generating an internal reset signal when the non-connection pin is set to a predetermined electric potential for a predetermined period.

In the present invention, when the output pin outputs the flag information, the output pin is set to the high impedance state. When the output pin is in the high impedance state, a resistive element may be connected between a higher potential power supply and the output pin or a lower potential power supply and the output pin so that the potential of the output pin is inverted from a potential when the flag information is in an active state.

The meritorious effects of the present invention are summarized as follows.

According to the present invention, the semiconductor memory device includes means for outputting the flag information, so that a system can distinguish whether the semiconductor memory device is the device having an SSR mode or the device without having the SSR mode. Further, according to the present invention, by outputting the flag information indicating that the processing for the exit from the SSR mode is under way, the system can detect completion of the exit from the SSR mode. For this reason, according to the present invention, the device having the SSR mode can be mounted on the system such as a general-purpose board.

According to the present invention, an exit time from the SR mode can be reduced according to the capability of the refresh characteristic of the memory cells.

Further, according to the present invention, a memory check operation after a return from the SSR mode to an idle state becomes unnecessary, thus contributing to effective reduction of the exit time and system improvement.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 10A, 10B and 10C include timing diagrams showing an operation of the embodiment of the present invention shown in FIG. 7;

PREFERRED EMBODIMENTS OF THE INVENTION

Preferred embodiments of the present invention will be described below. A device according to the present invention includes notification means for notifying from an external pin thereof to a system that the semiconductor memory device is the device having an SSR mode is provided. The notification means may be provided in a semiconductor memory device described with reference to FIGS. 1 and 2. The notification means may be provided in a semiconductor integrated circuit device with the semiconductor memory device described with reference to FIGS. 1 and 2 mounted on chip.

Further, the present invention may include means for notifying from the external pin to the system that exit processing from the SSR mode is under way (or the exit processing has been completed).

Further, the present invention may include means for notifying from the external pin to the system whether an exit operation from the SSR mode has been normally completed or not (or whether an error of which correction cannot be performed has been generated or not).

According to the present invention, decode processing on all cells is performed by the exit operation from the SSR mode. Thus, it can be determined that whether an error still remains or not after recovery, without performing a memory check operation. By including the function of notifying to the system (such as a DRAM controller and a CPU) whether error correction can be performed or not, an effective exit time in the SSR mode will not be extended, and conversely, the exit time will be greatly reduced. Further, a check bit region is not necessary, either. As this external pin, a non-connection pin (referred to as an "NC pin"), which is a free pin, is employed. The NC pin is the free pin to which no connection is established inside the device. The NC pin may be sometimes employed as a signal input/output terminal for a chip test or assigned to a new function.

The present invention includes an external input pin for resetting a DRAM device. As this external input pin, it is preferable that the non-connection pin (NC pin) is employed. The above-mentioned external pin may be an I/O pin, in which the input pin is commonly used with an output pin for outputting flag information.

As described above, in the present invention, a free pin (NC pin) among device pins is included as a flag pin, and information inside the device is output from the flag pin according to an internal state of the device. A flag signal from the semiconductor memory device is input to a GP (General Purpose)—IO port of the CPU, for example, and the system (CPU) detects the flag signal, thereby improving an operation efficiency. A detailed description will be given below with reference to drawings.

Figure 1:
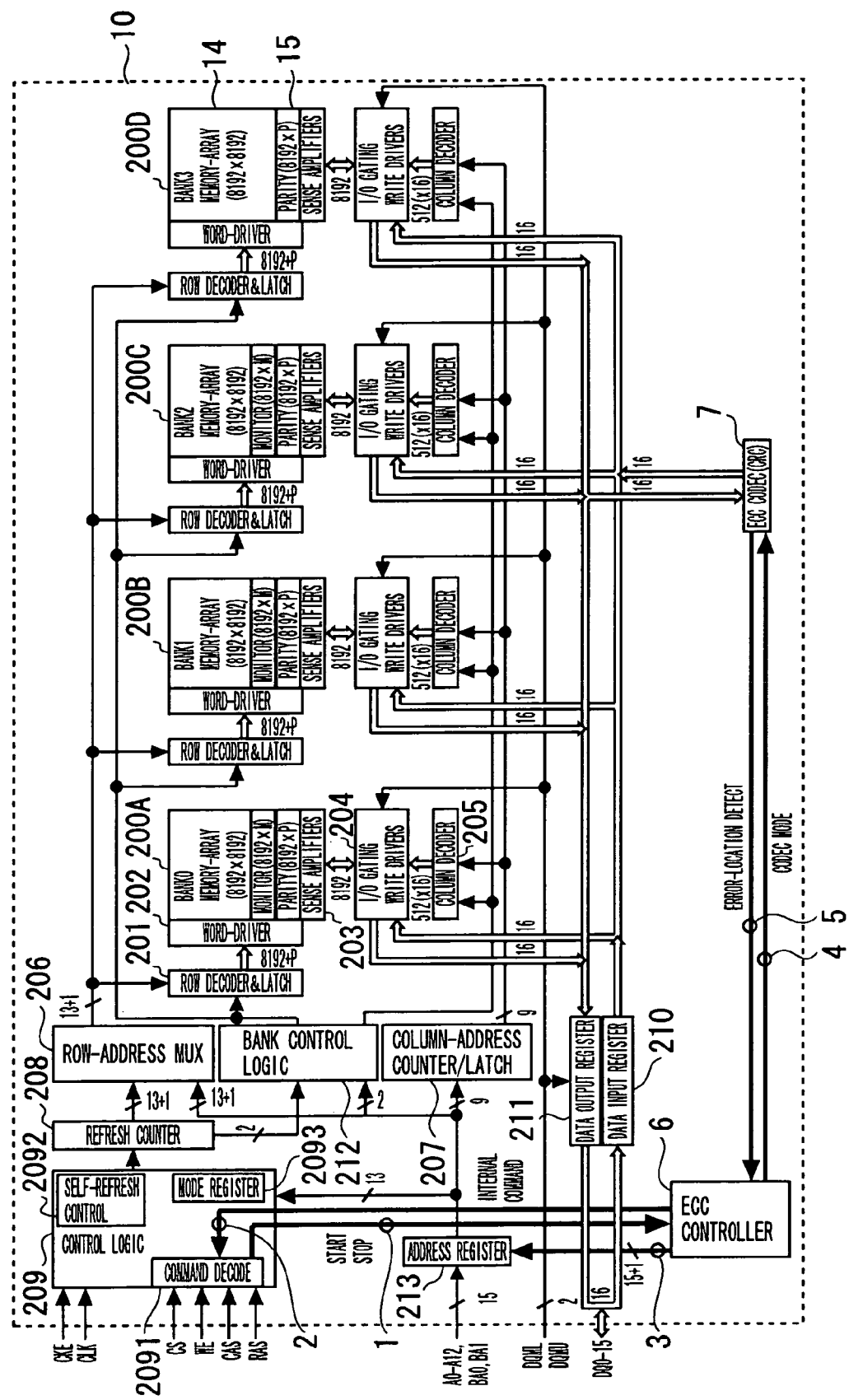
FIG. 1 is a diagram illustrating an example of a typical configuration of an SDRAM having an SSR mode.
Figure 2:
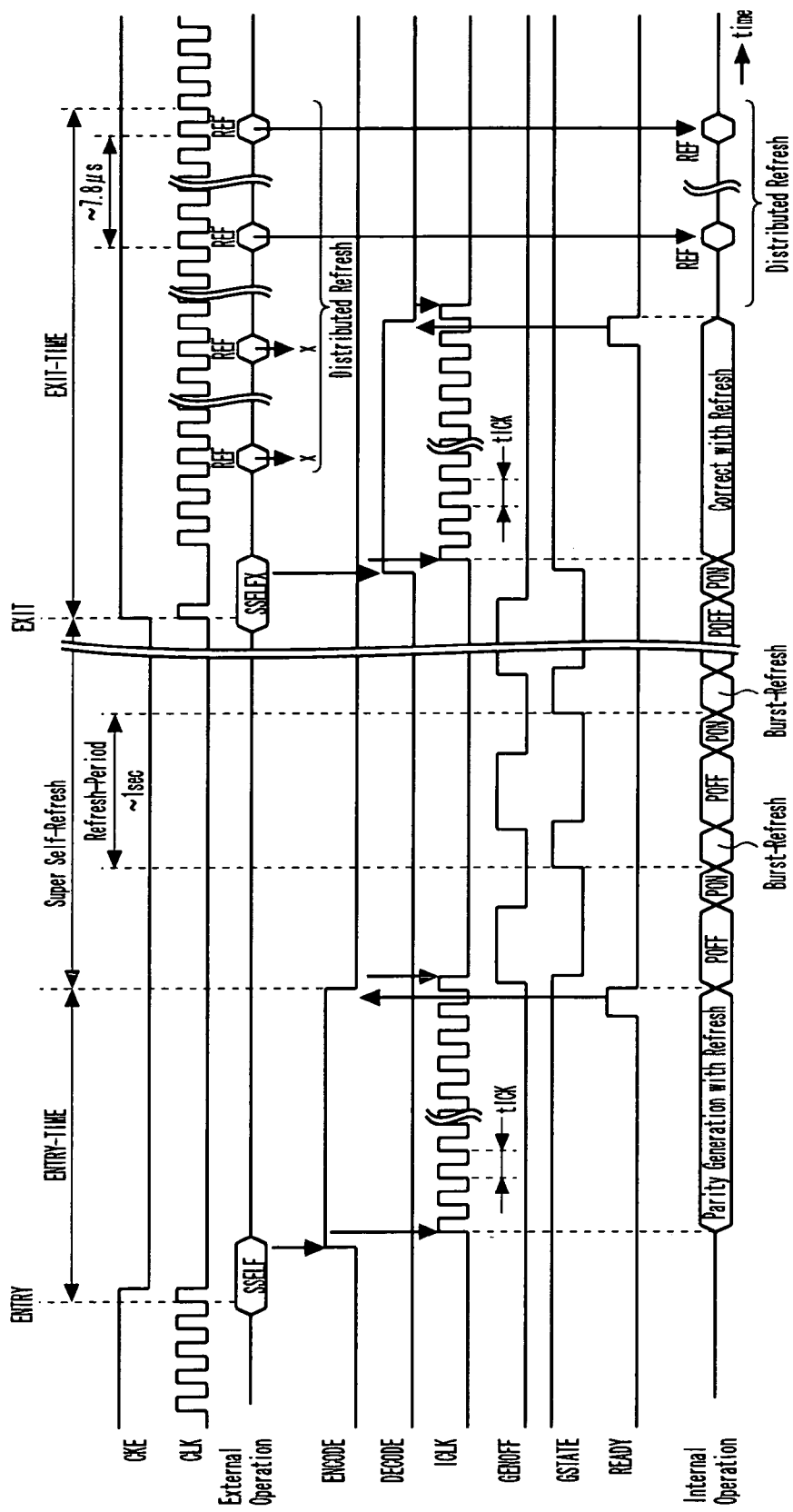
FIG. 2 is a timing diagram explaining an example of an operation of the SDRAM having the SSR mode in FIG. 1.

In the embodiments that will be described below, a description will be given in connection with an example in which the present invention has been applied to an SDRAM described with reference to FIGS. 1 and 2. One of the embodiments according to the present invention is configured to include, an SSR flag control circuit (refer to FIG. 9) described hereinafter, in the semiconductor memory device shown in FIG. 1, and a predetermined NC pin (an I/O cell) is used to output flag information. The configuration of the semiconductor memory device shown in FIG. 1 has been described in the above and hence the description of the configuration shown in FIG. 1 will be omitted only for the sake of avoiding duplication.

Figure 3:
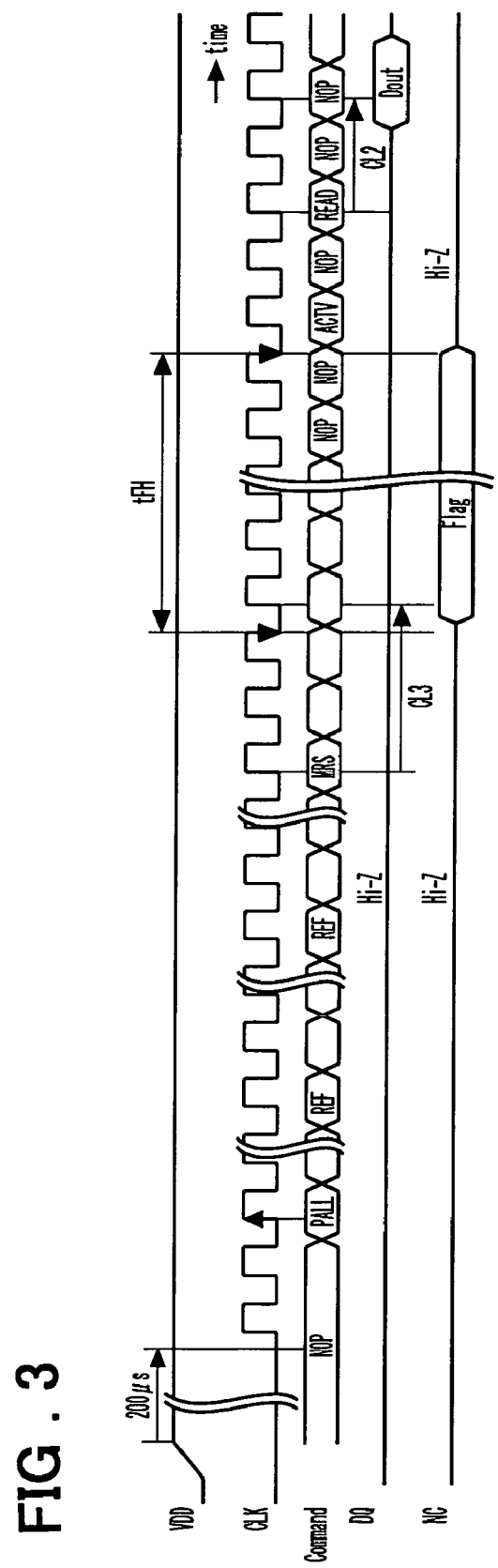
FIG. 3 is a timing diagram showing a processing operation of an embodiment of the present invention.

FIG. 3 is a timing diagram explaining an operation of the one embodiment of the present invention. Referring to FIG. 3, a VDD denotes an internal power supply voltage, a CLK denotes an external clock signal for synchronization, a command (Command) denotes the command input to a command decode circuit 2091 in FIG. 1, a DQ denotes a data input/output terminal, and an NC (non-connection pin) denotes a flag pin. In an example shown in FIG. 1, after a power supply and a clock signal have been stabilized at power-on, and after a pause period of 200 μs, for example, in order to ensure that an output is in a high impedance state, a clock enable signal CKE (which makes the CLK effective at a high level thereof) not shown and a DQM not shown (an output buffer for the DQ terminal is made to be in the high impedance state when the DQM is at the high level) are both made high, and precharging of all banks is performed (PALL: precharge all). Then, as dummy cycles, auto (CBR; Cas before Ras) refreshes (REFs) are repeated predetermined times, and a mode register setting command (MRS) is entered in order to perform initial setting of a mode register which is indicated by reference numeral 2093 in FIG. 1. In this case, the flag signal is then output from the NC pin for a predetermined period of time tFH (of the order of μs, for example).

Since the MRS command (for setting a burst length, a wrap type, a CAS latency value, and the like) for performing the initial setting of the mode register is input in a power-up sequence in the SDARM, a device having the SSR mode and a device without having the SSR mode can be distinguished by detecting the flag signal from the NC pin at the time of the start of the system. For this reason, switching control for the exit sequence of the SSR mode of the device having the SSR mode and the exit sequence of an SR of the device without having the SSR mode can be performed. The NC pin is set to be in the high impedance state (Hi-Z) during a time period as from input of the MRS command to output of the flag. After output of the flag, a normal operation is performed. In an example shown in FIG. 3, a bank active command (ACTV), a read command (READ), and the like are input as the normal operation, and readout data is output after CAS latency CL cycles of two. In the example shown in FIG. 3, a flag (SSROUT) indicating that the device is the one having the SSR mode is output after the MRS command has been captured at the rising edge of the clock signal CLK and then after a latency of three clock cycles. The latency in the present invention, however, is not, as a matter of course, limited to three clock cycles.

Figure 4:
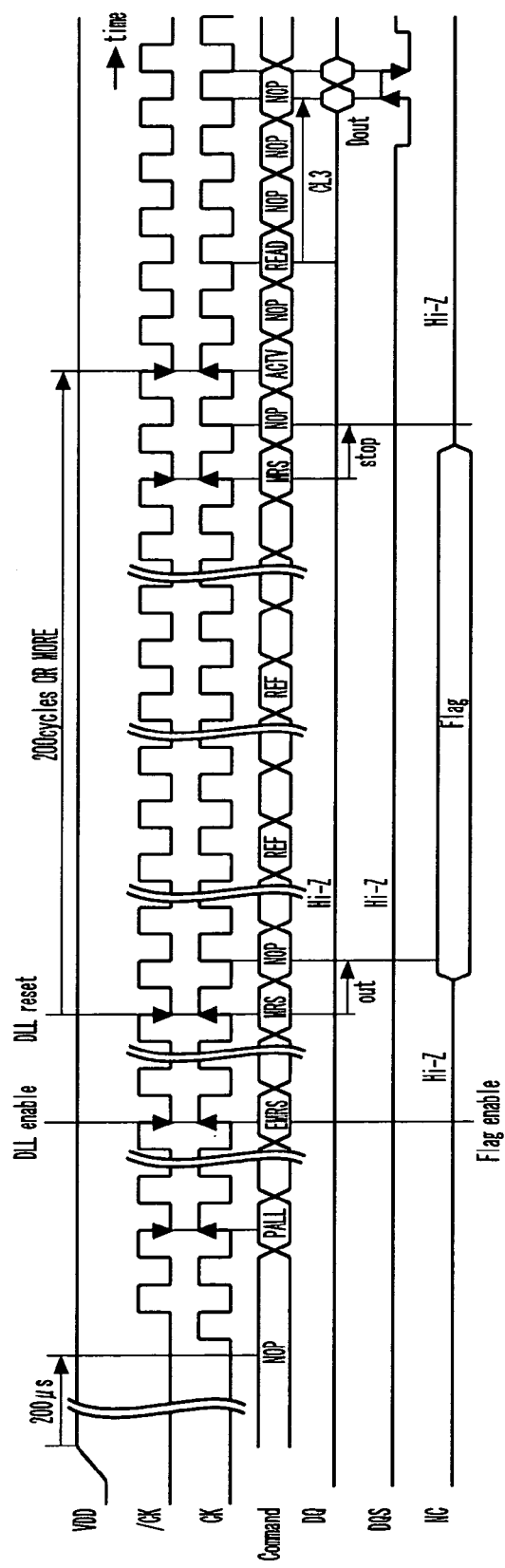
FIG. 4 is a timing diagram showing a processing operation of another embodiment of the present invention.

FIG. 4 is a timing diagram for explaining an operation of another embodiment of the present invention. It is the timing diagram in which the present invention has been applied to a DDR (Double Data Rate) SDRAM. /CK and CK are complementary clock signals, the command (Command) is the command input to a command register, the DQ is the data input/output terminal, a DQS is a data strobe signal, and the NC is the flag pin. In the power-up sequence, an EMRS (extended MRS) command for setting the operating mode of a DLL (Delay Lock Loop) circuit is input after all banks have been precharged. The DLL circuit not shown for inputting the differential clocks CK and /CK is thereby enabled, and the flag is enabled. After the MRS command has been subsequently input (at the rising edge of the CK), the DLL circuit is reset. Then, the flag indicating that the device is the one having the SSR mode is output from the NC pin for a predetermined period (such as 200 cycles or longer) from the rise of the next clock signal CK. During that period, commands for the auto refreshes (REFs) are input, and output of the flag is stopped by input of the next MRS command. Then, the flag pin is set in the Hi-Z mode. After output of the flag, the normal operation in the semiconductor memory device is executed. In an example shown in FIG. 4, the bank active command (ACTV), read command (READ), and the like are input, and readout data is output from the DQ terminal at rising and falling edges of the data strobe signal DQS (in synchronization with the rise and fall of the clock signal CK) after the CAS latency CL cycles of three. In the example shown in FIG. 4, the flag (SSROUT) indicating that the device is the one having the SSR mode is output at the rising edge of the next clock signal CK after the MRS command has been sampled at the rising edge of the clock signal CLK. The latency in the present invention, however, is not of course limited to three clock cycles.

Figure 5:
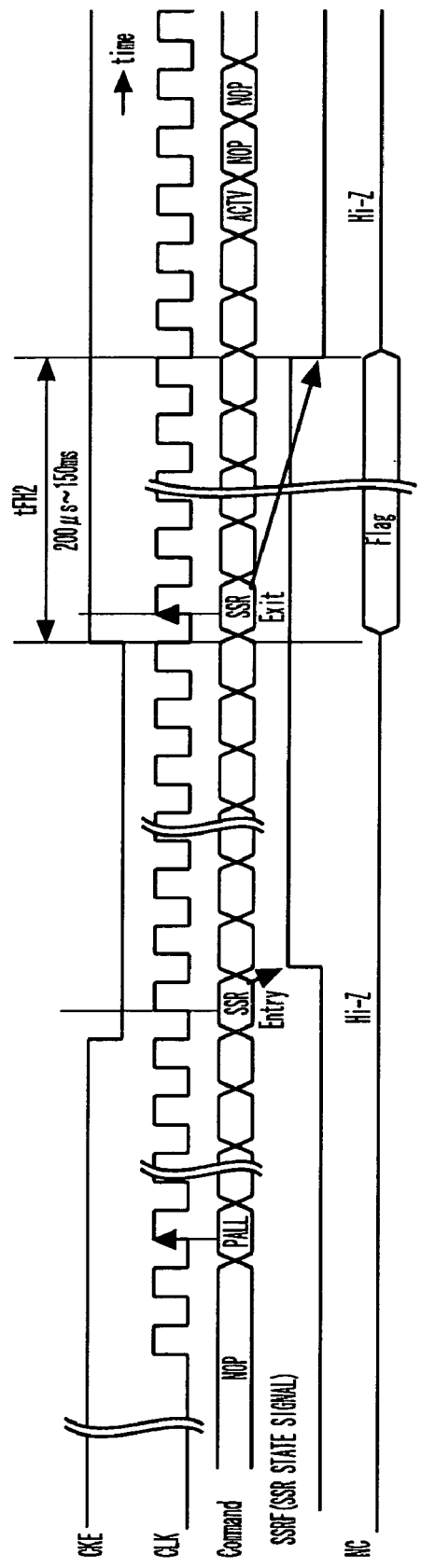
FIG. 5 is a timing diagram showing a processing operation of still another embodiment of the present invention.

FIG. 5 is a timing diagram for explaining an operation of another embodiment of the present invention, and is the diagram showing an example of an output operation of the flag during exist processing from the SSR mode. As shown in FIG. 5, in the present embodiment, a notification that the exit processing from the SSR mode is under way (decode processing is under way) is made from the NC pin to the external system. An SSRF, which is a signal indicating an SSR state, is set to be turned on in response to an entry into the SSR mode. Then, the clock enable signal CKE is set to be high from a low level, so that the clock signal CLK is made effective. Then, in response to input of an SSR exit command (at the rising edge of the CLK), a flag indicating that the exit processing is under way is output from the NC pin.

An SSR flag signal which is high in the SSR mode and low in an idle state is output as the flag by AND operation (forming the logical product) of the clock enable signal CKE and the flag SSRF indicating the SSR state. That is, when the clock enable signal CKE is high, the flag indicating the SSR state is output from the NC pin (the SSROUT that will be described hereinafter). Incidentally, the flag SSRF indicating the SSR state is turned on when an SSR mode entry command is input to the command decode circuit and decoded by the command decode circuit, and is reset by an SSR mode exit command. Then, since the clock enable signal CKE is an exit command from the SSR mode, output of the SSR flag can be performed in any state in the SSR mode during the exit processing. Entry into the SSR mode, parity generation by an ECC circuit, turning off of an internal power supply (POFF), burst-refresh (Burst-Refresh), and turning on of the internal power supply (PON) are repeated. Then, when the SSR exit command is input, an operation is transitioned to the exit processing, so that the decode processing by an ECC-CODEC 7 (refer to FIG. 1) is performed. Since the clock enable signal CKE is high and the SSRF (signal indicating the SSR state) is high, flag information is output from the NC pin. In this example, the output period of the flag (tFH2) is set to 200 μs to 150 ms. The output period of the flag depends on the number of cells targeted for error correction, i.e., the number of refresh failed cells.

Figure 6:
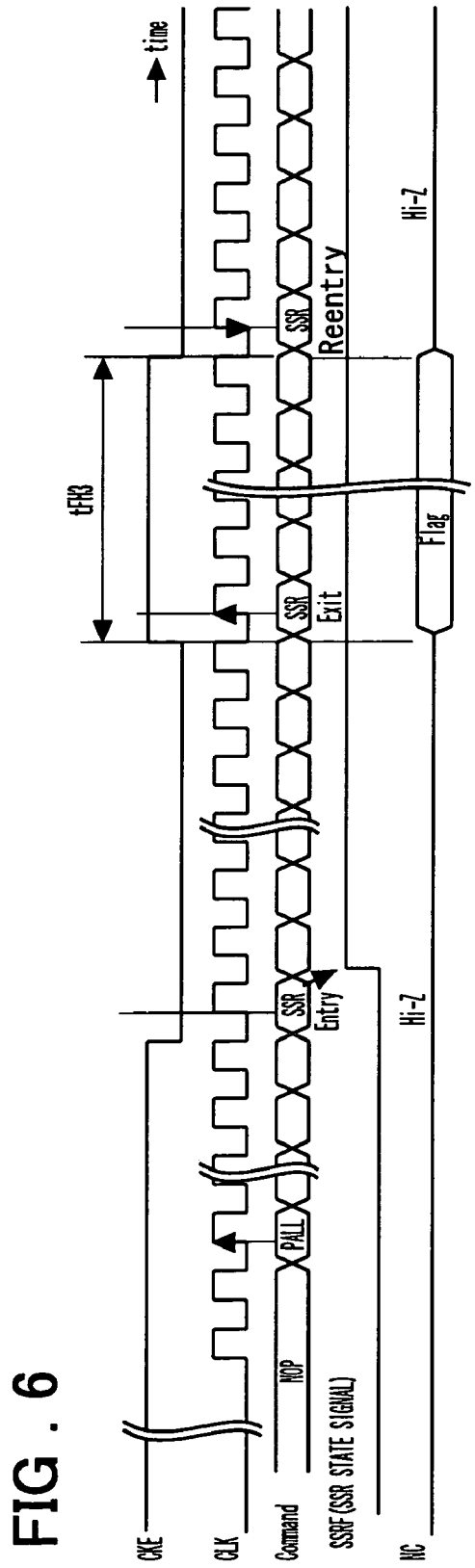
FIG. 6 is a timing diagram showing a processing operation of still another embodiment of the present invention.

FIG. 6 shows timing waveforms for explaining an operation of a still another embodiment of the present invention, and is the diagram showing the operation in which reentry into the SSR mode is performed during the exit processing from the SSR mode. As shown in FIG. 6, the SSRF, which is the signal indicating the SSR state, is set to be turned on in response to the entry into the SSR mode. The clock enable signal CKE is set to be high from the low level, and in response to input of the SSR exit command, the flag indicating that the exit processing is under way is output. While the exit processing from the SSR mode (such as the decode processing by the ECC-CODEC and the like) is being performed, the clock enable signal CKE is set to be high, so that the SSR flag information is output from the NC pin.

In the present embodiment, when the clock enable signal CKE is set to be low during the exit processing from the SSR mode, reentry into the SSR mode is performed. When the reentry is performed during the decode processing by the ECC-CODEC (indicated by reference numeral 7 in FIG. 1), for example, transition to a burst-refresh state is performed. When the reentry into the SSR mode is performed, the NC pin is brought into the high impedance state, so that the flag information is not output.

Figure 7:
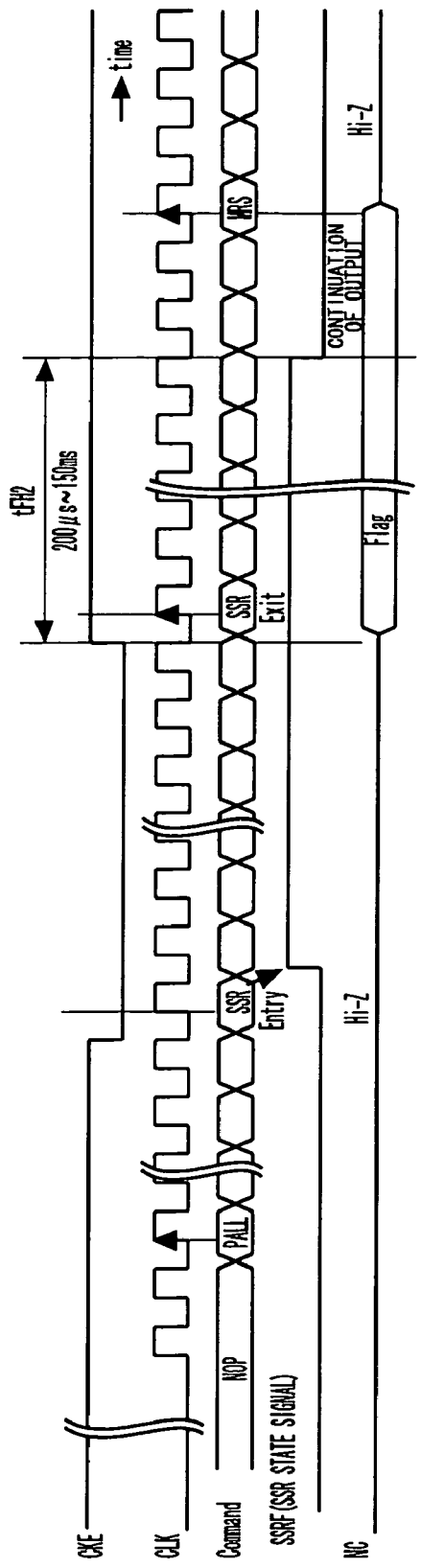
FIG. 7 is a timing diagram showing a processing operation of still another embodiment of the present invention.

FIG. 7 is a timing diagram explaining an operation of a still another embodiment of the present invention, and is the diagram showing timing operations when error correction cannot be performed. As shown in FIG. 7, in the present embodiment, when impossibility of the error correction is determined as a result of the error correction by the ECC-CODEC (indicated by reference numeral 7 in FIG. 1) during the decode operation of the exit processing from the SSR mode, output of the flag information from the NC pin is still continued after returning to the idle state.

Figure 9:
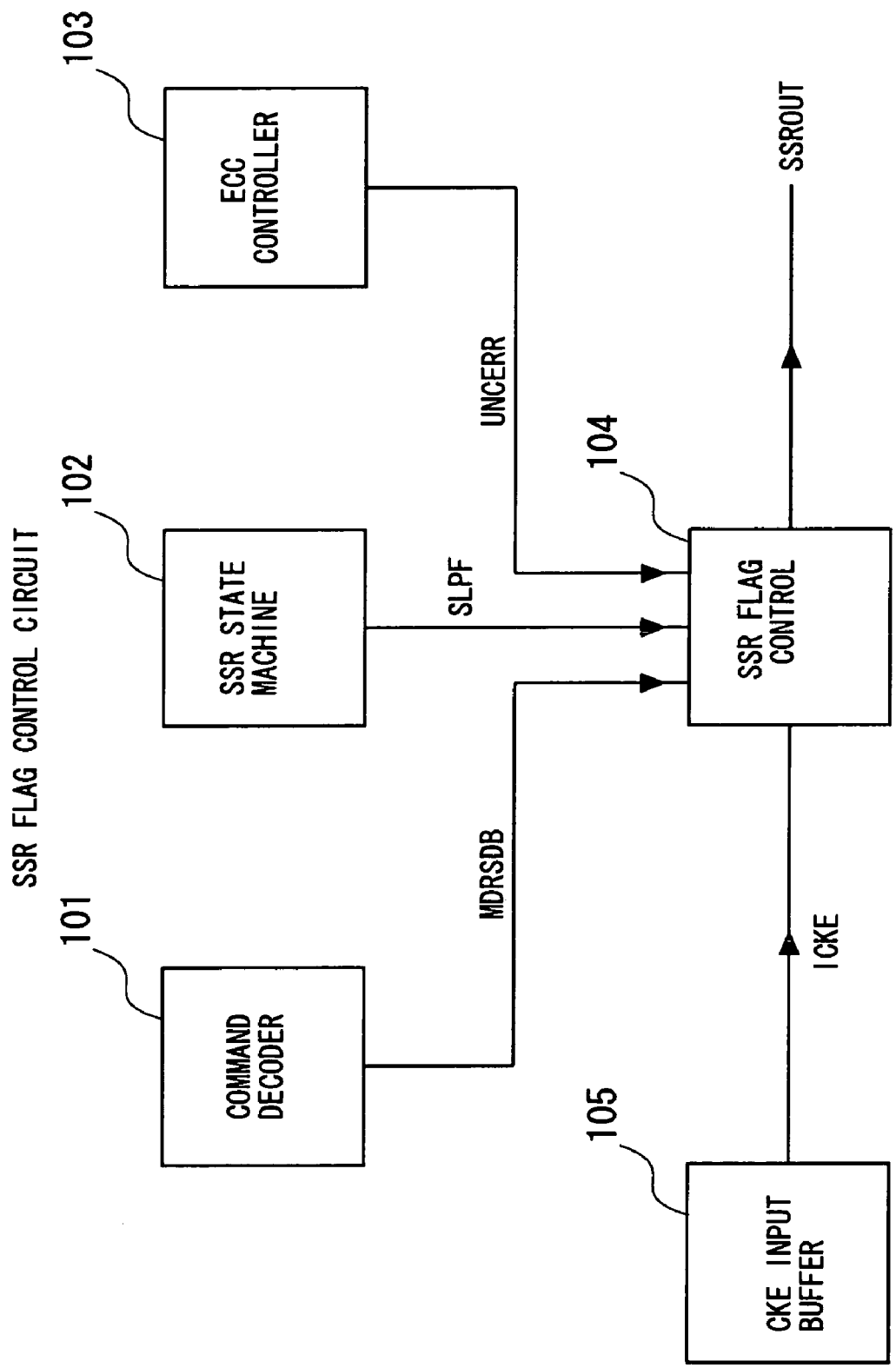
FIG. 9 is a diagram showing a configuration of an embodiment of the present invention.

In the present embodiment, disappearance of an error is detected during the decode operation by the ECC-CODEC (indicated by reference numeral 7 in FIG. 1), and an output indicating the result is sent from an ECC controller (indicated by reference numeral 6 in FIG. 1) to the SSR flag control circuit (refer to FIG. 9). By detecting the flag signal after elapse of a predetermined exit time (of 100 ms or longer), the system detects presence or absence of an error that cannot be corrected.

Continuation of output of the flag information is reset by input of the MRS command, so that the NC pin is returned to the high impedance state (Hi-Z). Alternatively, output of the flag information is executed for a predetermined time responsive to the input of the MRS command, and then returning to the high impedance state (Hi-Z) is performed.

Incidentally, in the present embodiment, in order to avoid a completely floating state in the high impedance state (the Hi-Z at the time of power-on and starting up) and in the system in which the flag pin is not used, a high-resistance short path to a lower supply potential VSS is provided inside the device when the flag signal from the NC pin is high (refer to a resistance R in FIG. 11 described in the below). When the flag signal from the NC pin is a low level output, a high-resistance short path to a high potential side power supply VDD is provided.

Figure 8:
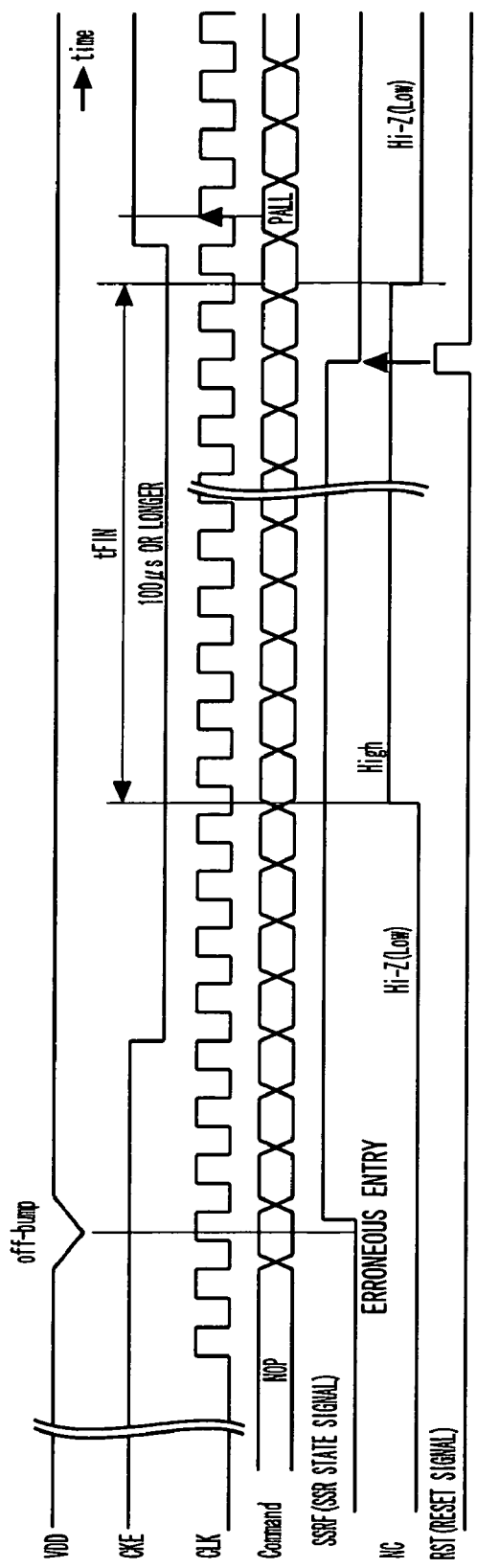
FIG. 8 is a timing diagram showing a processing operation of still another embodiment of the present invention.

FIG. 8 is a timing diagram for explaining an operation of still another embodiment of the present invention. A DRAM device with a forced resetting function will be described below. As is well known, a DRAM pin has no reset terminal. For this reason, it is not guaranteed that after power-on, a completely normal start is performed. When power-on for restarting the system is performed for some reason, the device effectively becomes an off-bump state (refer to "Off-Bump" of the VDD in FIG. 8), so that it sometimes happens that the reset signal inside the device is not issued. When an erroneous entry into a test mode in which an output from the DQ terminal is performed occurs, an I/O bus for the system will be abruptly driven. Then, the system detects this, and is sometimes brought into a state in which the restart cannot be permanently performed. In order to fundamentally solve such a problem, the SSR flag pin (NC pin for outputting the flag information) can be used as a reset pin in the present embodiment.

As shown in FIG. 8, when a high level voltage is continuously applied to the NC pin for a predetermined period (100 μl s) or longer while the clock enable signal CKE is low during the high level period of the flag signal from the NC pin, an internal reset signal RST is issued. Since output of the flag information from the NC pin is carried out when the clock enable signal CKE is high, output of the flag information and input of the reset signal will not collide.

FIG. 9 is a diagram showing a configuration of the SSR flag control circuit according to the present embodiment. An SSR flag control circuit 104 inputs a signal MDRSDB from a command decode circuit 101, a signal SLPF from an SSR state machine 102, an UNCEERR (indicating an error of which error connection cannot be performed) from an ECC controller 103, and an internal clock enable signal ICKE from a CKE input buffer 105, and outputs the signal SSROUT. The signal MDRSDB from the command decode circuit 101 notifies whether the device is the one having the SSR mode or not. The SSR state machine 102 controls state transitions such as an encode processing state at the time of an entry into the SSR mode, a super self refresh (a burst self-refresh state, a power-off state, a power-on state), a decoding state at the time of an exit from the SSR mode, and a reentry from the exit processing. The flag control circuit 104 outputs the SSR flag as the SSROUT at the timing described with reference to FIGS. 3 through 8.

FIGS. 10A, 10B and 10C are diagrams showing an operation of the SSR flag control circuit illustrated in FIG. 9. FIG. 10A is a timing diagram in case where the flag is output after input of the MRS command. When the MDRSDB goes low, the SSROUT is made high for a predetermined period of time.

FIG. 10B is a timing diagram in case where the flag indicating that the exit processing from the SSR mode is under way is output. When the internal clock enable signal ICKE transitions from the low level to the high level, when the SSROUT goes high, and when the SSRF is reset, the SSROUT is made low.

FIG. 10C shows a case in which error correction by the ECC-CODEC 7 cannot be performed. When the UNCERR is output from the ECC controller 6 to the SSR control circuit 104, output of the flag is continued.

Figure 11:
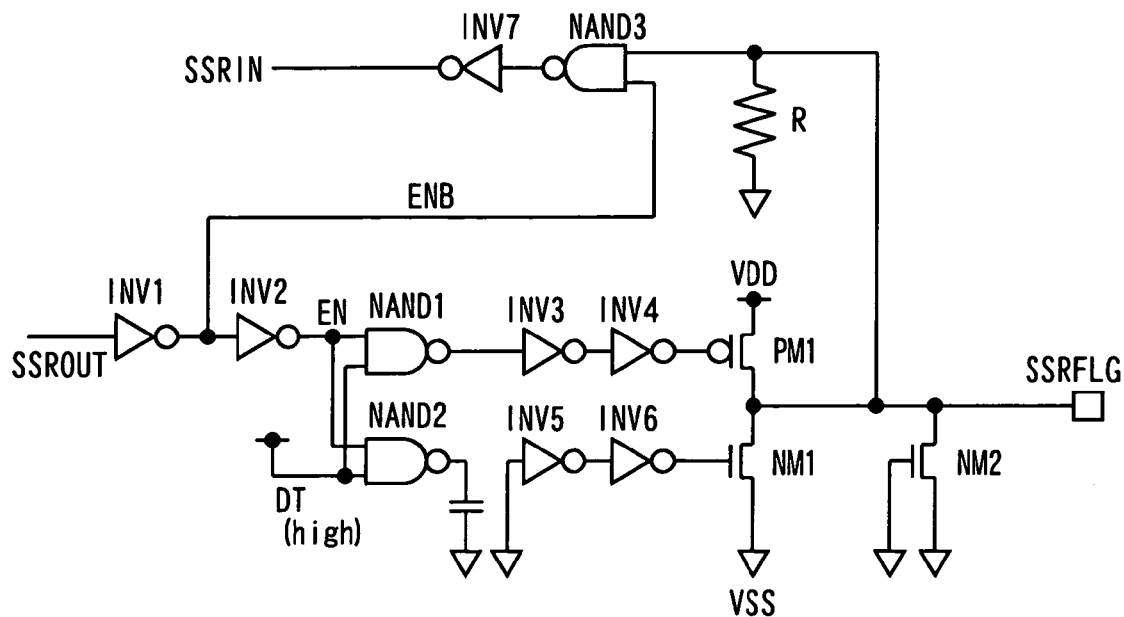
FIG. 11 is a diagram showing a configuration of an input/output circuit in the embodiments of the present invention.

FIG. 11 is a diagram showing an example of a configuration of an SSR flag output circuit in the present embodiment. FIG. 11 shows the configuration of an input/output circuit of the NC pin that outputs the flag information. Referring to FIG. 11, this input/output circuit outputs from the NC pin (SSR-FLG) the flag information indicating as to the device having the SSR mode (output of the flag after input of the MRS command), output of the flag during the exit processing from the SSR mode, and the flag information indicating that the error correction cannot be performed, supplied to the SSROUT.

The signal SSROUT that outputs the SSR flag is supplied to a negative AND circuit NAND 1 through inverters INV1 and INV2. When the SSROUT is high and a DT is high, the output of the NAND1 is made low and is transferred to the gate of a P-channel MOS transistor PM1 through inverters INV3 and INV4. The P-channel MOS transistor PM1 is turned on, so that the flag pin SSRFLG is made high. The output of an NAND 2 that inputs the DT, arranged in parallel with the NAND 1 is made to be open.

When the SSROUT is low, an output signal ENB (enable signal) of the inverter INV1 is made high, and an inverted signal of the value at the flag pin SSRFLG is supplied to an inverter INV7 through the NAND 3. An SSRIN output from the output of the inverter INV7 is supplied to an internal circuit which generates the internal reset signal. When the SSROUT is high, the signal ENB is made low, and the output of the NAND 3 is made high. The value of the SSRFLG is thus masked, and is not transferred to the SSRIN.

Figure 12:
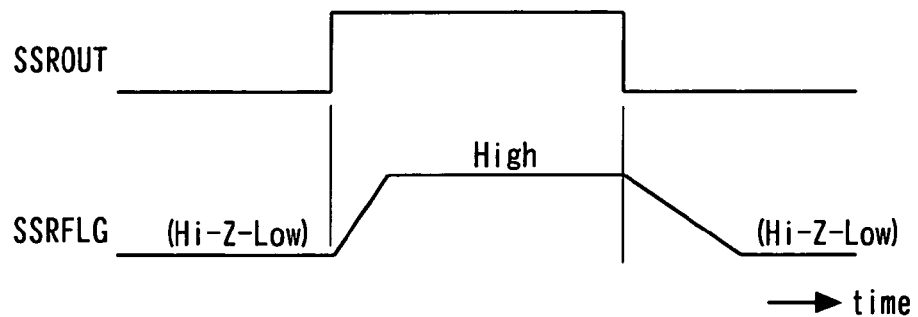
FIG. 12 is a diagram showing signal waveforms of the input/output circuit in the embodiments of the present invention.

FIG. 12 is a diagram showing signal waveforms of the SSROUT and the SSRFLG in the circuit shown in FIG. 11. As shown in FIG. 12, when the SSROUT rises high from the low level, the SSRFLG (at the NC pin) goes high from the high impedance state (Hi-Z). When the SSROUT falls low from the high level, the SSRFLG (at the NC pin) returns to the high impedance state (Hi-Z). At the time of the high impedance state (Hi-Z), the flag pin (SSRFLG) is made low through the resistance R.

As described above, the present embodiment includes the SSR flag, so that the system can distinguish whether the device is the one having the SSR mode or not. Then, the system can detect completion of an exit from the SSR mode.

Further, thanks to the function of the SSR flag pin, the device having an SSR function can be mounted on the system such as a general-purpose board, and the time of the exit from the SSR mode can be reduced according to the capability of the refresh characteristic the memory cells.

Further, according to the present embodiment, a memory check operation after a return from the SSR mode to the idle state becomes unnecessary, thus contributing to effective reduction of the exit time and system improvement. More specifically, even if it takes time to perform decode processing at the time of the exit from the SSR mode, the memory check operation (that is carried out during exit processing from a normal self-refresh operation, for example) after the exit from the SSR mode becomes unnecessary. Thus, the overall exit time is reduced.

Figure 13:
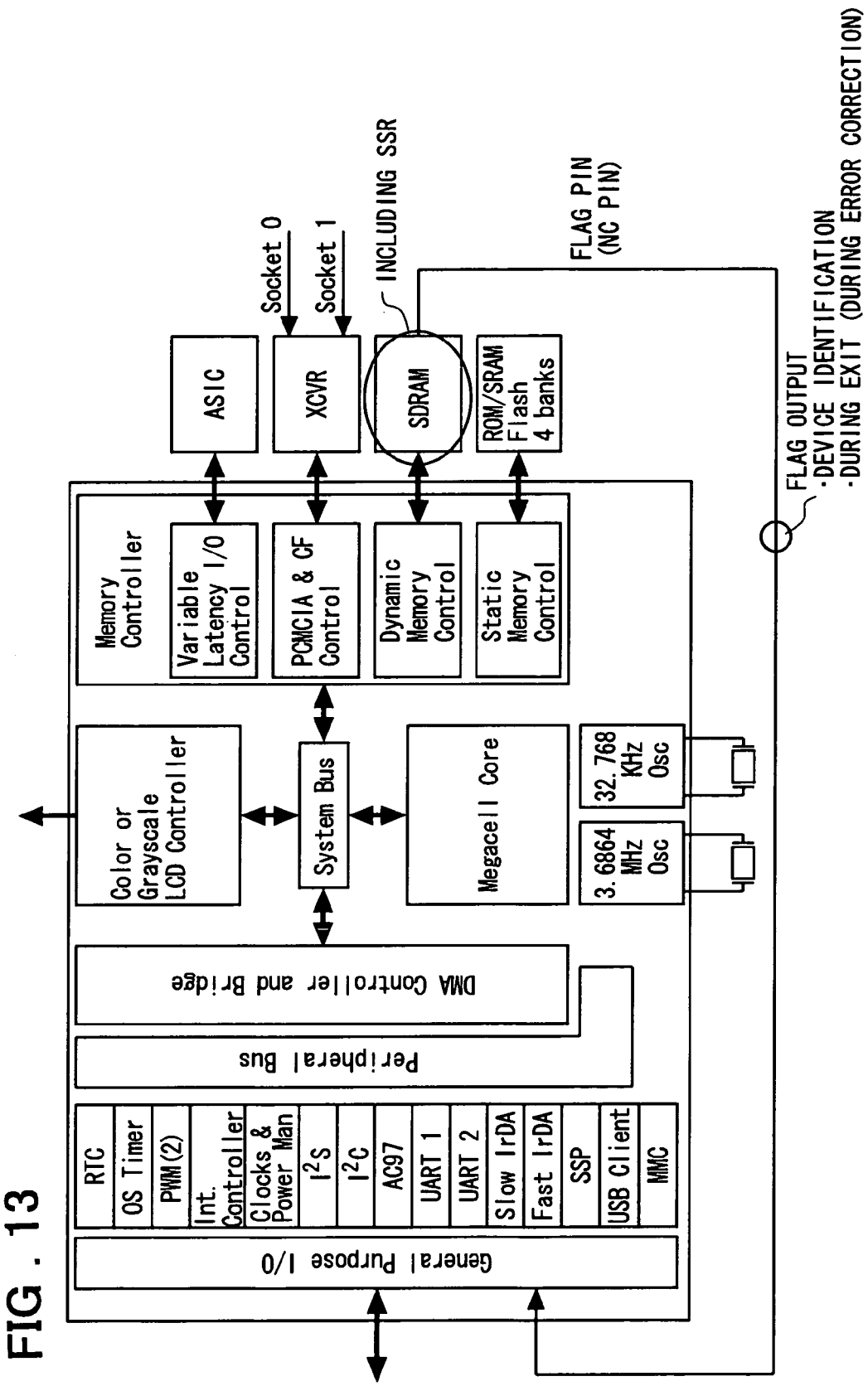
FIG. 13 is a diagram explaining an example of a connecting configuration of the SDRAM of the present invention.
Figure 14:
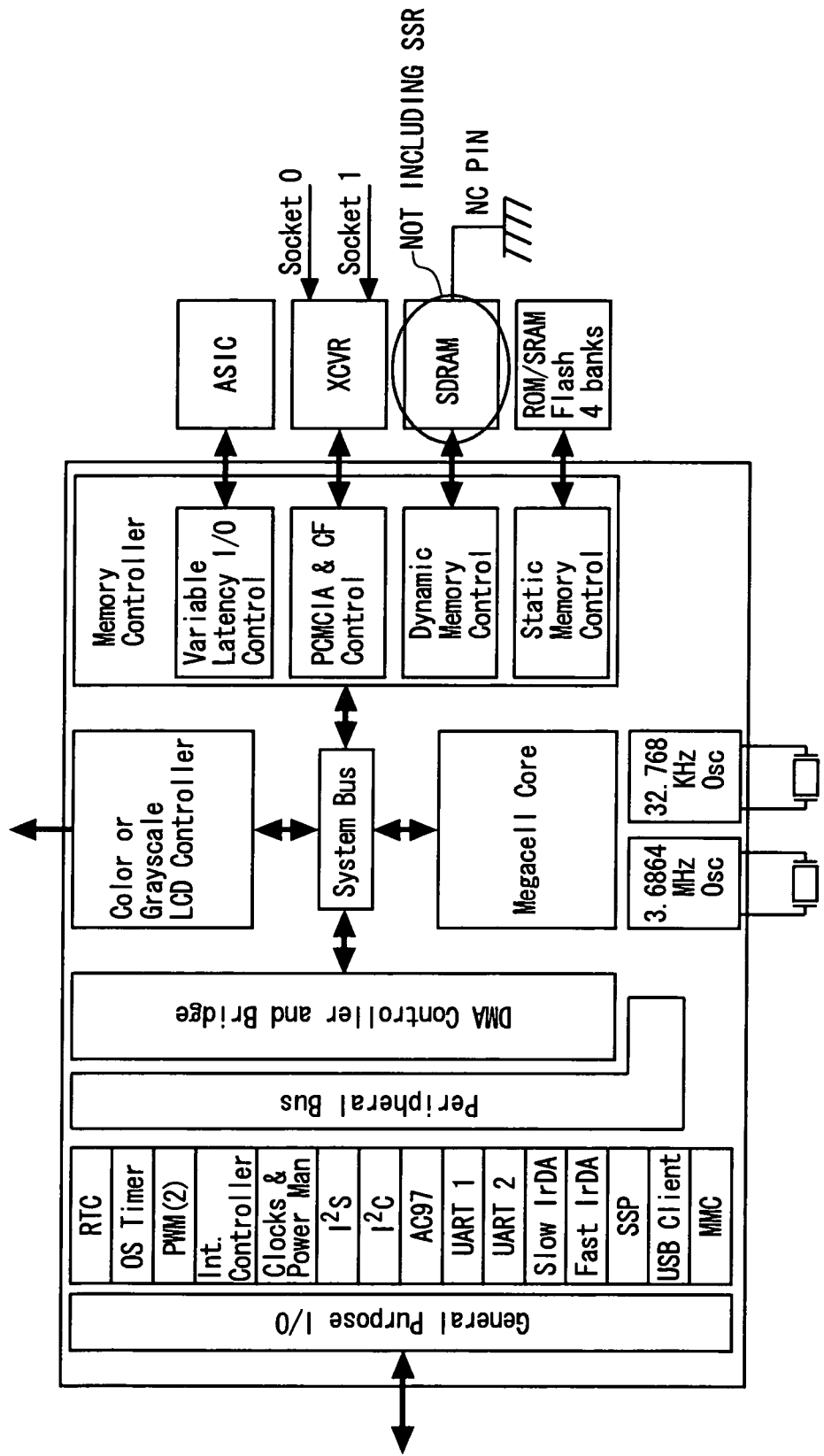
FIG. 14 is a diagram explaining an example of a connecting configuration of a conventional SDRAM.

FIG. 13 is a diagram showing a connecting configuration of a semiconductor memory device having the SSR function to which the present invention has been applied and the CPU. FIG. 14 is a diagram showing an example in which a semiconductor memory device without having the SSR function is connected to the same CPU. In the example shown in FIG. 14, the NC pin of the SDRAM (Synchronous DRAM) is grounded (at a ground potential). On the other hand, as shown in FIG. 13, in the SDRAM to which the present invention has been applied, the NC pin is employed as the pin for outputting the flag information, as described before. That is, as shown in FIG. 13, the pin for outputting the flag information is connected to a GP (General Purpose)—I/O of the CPU. The CPU can determine from the flag information that the DRAM is the device having the SSR mode, the exit processing from the SSR mode is under way (or has been completed), the error correction cannot be performed after an exit from the SSR mode, and the like. Further, as shown in FIG. 13, this SDRAM can share an interface with a conventional SDRAM (refer to FIG. 14) and can also be mounted on the same substrate, module, or the like. A dynamic memory control unit in a memory controller controls passing of addresses, data, and commands with the SDRAM. Referring to FIGS. 13 and 14, the CPU includes the memory controller (Memory Controller) having a variable latency I/O control unit, a PCMCIA & CF control unit, the dynamic memory control unit, and a static memory control unit, a color or grayscale LCD controller, a megacell core (MegaCell Core), the general-purpose I/O (General Purpose-I/O), a peripheral bus (Peripheral Bus), a DMA controller and bridge (DMA Controller & Bridge), a system bus (System Bus), a real time clock (RTC), a timer, a PWM, UARTs, an I²C, an I²S, and an AudioCodec 97, IrDAs, a USB client, an MMC, and others on chip. Since details of them are not directly related to the present invention, descriptions of them will be omitted.

As an example of a variation of the embodiments described above, the flag information from the NC pin may be set to be enabled or disabled, through input of a command. When output of the flag information is enabled, the flag information is output from a predetermined NC pin. When output of the flag information is disabled, the flag information from the NC pin is not output. In this case, a predetermined bit of an address signal may be assigned to the enabled or disabled output of the flag information at the time of the command input, and using the mode register setting command, for example, setting in the mode register may also be performed.

Alternatively, as an example of a variation of the embodiments described above, an internal state in the SSR mode (for instance, encode processing at the time of an entry, a super self refresh, or decode processing at the time of an exit) may be output. Alternatively, information such as the number of errors may also be output by the ECC circuit or the like. Alternatively, when a plurality of free pins (NC pins) is present, information as to the device having the SSR mode, information indicating that the exit processing from the SSR mode is under way, and information indicating impossibility of the error correction may be output from different pins, respectively.

In the embodiments described above, a free NC pin was employed as the pin for outputting the flag information, because use of the free NC pin is suitable for preventing an increase in a pin count. However, the present invention is not of course limited to the configuration described above. The SSRFLG in FIG. 11, for example, may be provided for the device as a dedicated I/O pin instead of the NC pin.

The foregoing description was given in connection with the embodiments described above. The present invention, however, is not limited to only the configurations of the embodiments described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:
1. A semiconductor memory device comprising:
a memory array including a plurality of memory cells, each requiring a refresh operation for data retention; and
an ECC (Error Correction Circuit) for performing calculation of
parity information on data of said memory cells and for performing error correction of said memory cells;

said semiconductor memory device entering from a normal operation state into a data retention operating mode upon receipt of a command to enter into the data retention operating mode and for returning to the normal operation state upon receipt of a command to exit from the data retention operating mode;

wherein the data retention operating mode includes:

encode processing for performing calculation of parity information on data of said memory cells by said ECC when said semiconductor memory device enters into the data retention operating mode;

self-refresh processing including a burst self-refresh state for intensively performing a self refresh on said memory cell array, a power-off state for turning off a part of an internal power supply circuit of said semiconductor memory device for a predetermined period, and a power-on state for returning said internal power supply circuit in an off state to an on state; and decode processing for performing error correction of said memory cells by said ECC upon receipt of the command to exit from the data retention operating mode;

said semiconductor memory device further comprising a circuit for outputting flag information indicating an internal state of said semiconductor memory device from a predetermined output terminal.

2. A semiconductor memory device comprising:

a memory array including a plurality of memory cells each requiring a refresh operation for data retention;

an ECC (Error Correction Circuit) for performing a calculation of parity information on data of said memory cells when said semiconductor memory device enters into a data retention operating mode and performing error correction of said memory cells at a time of an exit from the data retention operating mode; and a circuit for outputting from a predetermined output terminal flag information indicating that said semiconductor memory device is the semiconductor memory device equipped with a function of the data retention operating mode.

3. The semiconductor memory device according to claim 2, further comprising:

a mode register in which initial setting of an operating mode of said semiconductor memory device is performed; and a circuit for performing control such that the flag information is output in response to input of a mode register setting command for performing setting of said mode register.

4. The semiconductor memory device according to claim 3, wherein the flag information is output from said output terminal for a predetermined period.

5. The semiconductor memory device according to claim 4, further comprising a circuit for performing control so that the output of the flag information is stopped responsive to the mode register setting command input after the predetermined period.

6. The semiconductor memory device according to claim 2, further comprising a circuit for outputting from said predetermined output terminal flag information indicating that processing for the exit is under way when the exit from the data retention operating mode is performed.

7. The semiconductor memory device according to claim 6, wherein a reentry into the data retention operating mode from the processing for the exit from the data retention operating mode is accommodated.

8. The semiconductor memory device according to claim 2, further comprising a circuit for performing control so that when a reentry into the data retention operating mode is made during the processing for the exit from the data retention operating mode, the output of the flag information is stopped and said output terminal is set to a high impedance state.

9. The semiconductor memory device according to claim 2, further comprising a circuit for outputting from said predetermined output terminal flag information indicating that the error correction cannot be performed when said ECC determines that the error correction cannot be performed during the processing for the exit from the data retention operating mode.

10. The semiconductor memory device according to claim 9, wherein the flag information indicating that the error correction cannot be performed is output from said predetermined output terminal for a predetermined period after completion of the processing for the exit.

11. A semiconductor memory device comprising:

a memory array including a plurality of memory cells each requiring a refresh operation for data retention;

an ECC (Error Correction Circuit) for performing calculation of parity information on data of said memory cells when said semiconductor memory device enters into a data retention operating mode and performing error correction of said memory cells at a time of an exit from the data retention operating mode; and a circuit for outputting from a predetermined output terminal flag information indicating that a processing for the exit is under way when the exit from the data retention operating mode is performed.

12. The semiconductor memory device according to claim 11, wherein a reentry into the data retention operating mode from the processing for the exit from the data retention operating mode is accommodated.

13. The semiconductor memory device according to claim 11, further comprising:

a circuit for outputting from said predetermined output terminal flag information indicating that the error correction cannot be performed when said ECC determines that the error correction cannot be performed during the processing for the exit from a function of the data retention operating mode.

14. The semiconductor memory device according to claim 13, wherein the flag information indicating that the error correction cannot be performed is output from said predetermined output terminal for a predetermined period after completion of the processing for the exit.

15. The semiconductor memory device according to claim 12, comprising a circuit for stopping the output of the flag information and setting said output terminal to a high impedance state when a reentry into the data retention operating mode is made during the processing for the exit from the data retention operating mode.

16. A semiconductor memory device comprising:

a memory array including a plurality of memory cells each requiring a refresh operation for data retention;

an ECC (Error Correction Circuit) for performing calculation of parity information on data of said memory cells when said semiconductor memory device enters into a data retention operating mode and performing error correction of said memory cells at a time of an exit from the data retention operating mode;

a circuit for outputting from a predetermined output terminal flag information indicating that the error correction cannot be performed when said ECC determines that the error correction cannot be performed during a processing for the exit from the data retention operating mode.

17. The semiconductor memory device according to claim 16, wherein the flag information indicating that the error correction cannot be performed is output from said predetermined output terminal for a predetermined period after completion of the processing for the exit.

18. The semiconductor memory device according to claim 1, further comprising a resistive element connected between said output terminal for outputting the flag information and a higher potential power supply or between said output terminal and a lower potential power supply, so that when said output terminal is in the high impedance state, a potential of said output terminal becomes inverted from a potential when the flag information is in an active state.

19. The semiconductor memory device according to claim 1, wherein said output terminal is set to the high impedance state before said output terminal outputs the flag information in the active state and after said output terminal has output the flag information.

20. The semiconductor memory device according to claim 1, wherein said output terminal is a terminal selected from non-connection pins of said semiconductor memory device.

21. The semiconductor memory device according to claim 1, wherein said output terminal for outputting the flag information is constituted from an input/output terminal selected from non-connection pins; and wherein said semiconductor memory device comprises a circuit for generating an internal reset signal by fixing said input/output terminal at a predetermined potential for a predetermined period.

22. The semiconductor memory device according to claim 21, wherein said input/output terminal is employed as an input terminal for generating the internal reset signal when the flag information is not output from said input/output terminal.

23. The semiconductor memory device according to claim 22, wherein when a clock enable signal controlling effectiveness and ineffectiveness of an input clock signal indicates a value making the clock signal ineffective, the flag information is not output from said input/output terminal, and said input/output terminal is employed as said input terminal for generating the internal reset signal.

24. A semiconductor memory device including:

a memory cell array having a plurality of memory cells each requiring a refresh operation for data retention;

at least one non-connection pin; said non-connection pin used for an input of a reset signal; and a circuit for generating an internal reset signal to initialize the memory device when the reset signal at the non-connection pin takes a predetermined electric potential for a predetermined period.

* * * * *